(12) United States Patent
Morie et al.

(10) Patent No.: US 7,605,645 B2
(45) Date of Patent: Oct. 20, 2009

(54) TRANSCONDUCTOR, INTEGRATOR, AND FILTER CIRCUIT

(75) Inventors: Takashi Morie, Osaka (JP); Akinori Matsumoto, Osaka (JP); Shiro Dosho, Osaka (JP)

(73) Assignee: Panasonic Corporation, Osaka (JP)

( * ) Notice: Subject to any disclaimer, the term of this patent is extended or adjusted under 35 U.S.C. 154(b) by 196 days.

(21) Appl. No.: 11/643,704

(22) Filed: Dec. 22, 2006

(65) Prior Publication Data

US 2007/0146064 A1 Jun. 28, 2007

(30) Foreign Application Priority Data

Dec. 28, 2005 (JP) ............................. 2005-378685

(51) Int. Cl.
G06G 7/12 (2006.01)
(52) U.S. Cl. ...................................... 327/563; 327/103
(58) Field of Classification Search ................. 327/335, 327/336, 563, 103; 330/252, 257
See application file for complete search history.

(56) References Cited

U.S. PATENT DOCUMENTS

| | | | | |
|---|---|---|---|---|
| 4,728,900 A | * | 3/1988 | Nakagawara et al. | 330/253 |
| 4,914,408 A | | 4/1990 | Voorman | |
| 5,489,872 A | * | 2/1996 | Gopinathan | 327/552 |
| 5,912,583 A | * | 6/1999 | Pierson et al. | 327/553 |
| 6,456,158 B1 | * | 9/2002 | Giuroiu | 327/563 |
| 6,677,822 B2 | | 1/2004 | Hasegawa | |
| 6,727,757 B1 | * | 4/2004 | Venkatraman et al. | 330/259 |
| 7,091,785 B2 | * | 8/2006 | Deval et al. | 330/253 |
| 7,279,974 B2 | * | 10/2007 | Rowley | 330/253 |

* cited by examiner

*Primary Examiner*—Lincoln Donovan
*Assistant Examiner*—Hai L Nguyen
(74) *Attorney, Agent, or Firm*—McDermott Will & Emery LLP

(57) ABSTRACT

A transconductor for receiving a differential voltage signal and outputting a differential current signal, includes two transconductors for receiving the differential voltage signal and outputting a single-end current signal. An inversion input terminal of one of the two transconductors is connected with a non-inversion input terminal of the other. The transconductor outputs a current signal output from each of the two transconductors as the differential current signal.

9 Claims, 9 Drawing Sheets though a common-mode feedback circuit is not provided, common-mode oscillation does not occur. Therefore, the phase compensating capacitor does not have to be provided and the chip area is not increased. Further, since a current source for monitoring a common-mode potential does not have to be provided, a noise source in the signal line is eliminated, so that noise characteristics are improved.

TRANSCONDUCTOR, INTEGRATOR, AND FILTER CIRCUIT

CROSS REFERENCE TO RELATED APPLICATIONS

This Non-provisional application claims priority under 35 U.S.C. §119(a) on Patent Application No. 2005-378685 filed in Japan on Dec. 28, 2005, the entire contents of which are hereby incorporated by reference.

BACKGROUND OF THE INVENTION

1. Field of the Invention

The present invention relates to a transconductor, and more particularly, to a fully differential transconductor whose input and output are all differential signals, and an integrator and a filter circuit comprising the transconductor.

2. Description of the Related Art

Complex filters for use in Low-IF radio architecture play a role in efficiently eliminating an aliasing image signal in the same band in which desired waves are present, in the course of down conversion. By using the complex filter, an image eliminating filter having a high Q value is no longer required. Therefore, the complex filter is recognized as an important part for development of a one-chip radio system and a reduction in cost.

In recent years, there is a keen demand for low-power radio systems in terms of portability and the like. Therefore, it is also one of important challenges to achieve a low-power complex filter. Initially, a complex filter composed of an operational amplifier was proposed (see, for example, Japanese Patent No. 2988583). Later, a lower-power complex filter having a Gm-C structure (hereinafter also referred to as a Gm-C filter) was proposed (see, for example, Japanese Patent No. 3584893).

The Gm-C filter refers to a filter composed of a transconductor (Gm) which converts a voltage signal into a current signal and a capacitor (C) which integrates the current signal. The Gm-C filter has lesser linearity than a filter employing an operational amplifier, and therefore, often has a fully-differential structure. Therefore, a common-mode feedback circuit is required to stabilize a bias point (also referred to as a common-mode operating point) of a differential output.

In fully differential Gm-C filters, common-mode oscillation may occur due to the structure thereof. Therefore, it is considerably important to stabilize a common-mode potential in the fully differential Gm-C filter. Therefore, a relatively large common-mode feedback circuit is provided in conventional fully differential Gm-C filters. Particularly, when a complex filter is composed of a fully differential Gm-C filter, a common-mode potential becomes considerably unstable due to the structure of the complex filter, and therefore, a lager-scale common-mode feedback circuit is required. However, the large common-mode feedback circuit is responsible for an increase in chip area and power consumption. Also, a common-mode current in a signal line may be increased so as to stabilize the common-mode potential, however, this leads to a deterioration in noise characteristics.

FIG. 10 is a configuration of a conventional fully differential transconductor. The transconductor operates as a voltage-to-current conversion circuit which converts a differential voltage signal (Vin⁺–Vin⁻) into a differential current signal (Iout⁺–Iout⁻). The conventional transconductor has a common-mode gain of about 100-fold. Therefore, when the voltage signals Vin⁺ and Vin⁻ are at the H level (or the L level) at respective input terminals, the current signals Iout⁺ and Iout⁻ are at the L level (or the H level) at respective output terminals. In other words, the conventional transconductor has a property that the common-mode potential of the output differential signal changes largely with respect to a small change in the common-mode of the input voltage signal. Therefore, a common-mode feedback circuit (CMFB) for monitoring the voltage at the output terminal to adjust a bias for the differential current signal is required to stabilize the voltage of the output terminal. Further, a phase compensating capacitor is required to stabilize the common-mode feedback.

FIG. 11 illustrates a configuration of a complex filter composed of fully differential transconductors and capacitors. The complex filter can be divided into three main parts: an I filter 100, a Q filter 200, and a gyrator 300. The gyrator 300 plays a role in connecting the I filter 100 and the Q filter 200 in a quadrature phase relationship, and has an operation equivalent to that of a latch composed of cross-connected inverters when viewed in terms of a common-mode voltage. Specifically, positive feedback is performed so that, when the common-mode output terminal voltage of a transconductor Gm in any one of the I filter 100 and the Q filter 200 is at the H level (or the L level), the common-mode output terminal voltage of a transconductor Gm in the other is at the L level (or the H level). Further, a gm value of the gyrator portion is usually set to be several times or more larger than those of the other portions, positive feedback acts more strongly. As a result, the whole complex filter becomes unstable since. the common-mode voltage is positively fed back in a checkered pattern as indicated by H and L in FIG. 11.

Therefore, when a complex filter is composed of conventional fully differential transconductors, a common-mode feedback circuit which has a gain higher than that of the positive feedback in the gyrator and stabilizes the common-mode potential more quickly is essentially required. However, such a common-mode feedback circuit has large power consumption, and prevents the reduction of the power of a chip. Also, a noise generating factor, such as a current source or the like, is connected to a signal line, leading to a deterioration in noise characteristics. Also, a relatively large phase compensating capacitor is required to stabilize the common-mode feedback, leading to an increase in chip area.

SUMMARY OF THE INVENTION

In view of the above-described problems, an object of the present invention is to provide a fully differential transconductor in which a common-mode operating point of a differential output is stabilized, power consumption and a chip area are reduced, and noise characteristics are improved. Another object of the present invention is to provide an integrator and a filter circuit comprising the transconductor.

To achieve the object, the present invention provides a transconductor for receiving a differential voltage signal and outputting a differential current signal, comprising a first transconductor and a second transconductor for receiving the differential voltage signal and outputting a single-end current signal, in which an inversion input terminal of one of the first and second transconductors is connected with a non-inversion input terminal of the other, and the transconductor outputs a current signal output from each of the first and second transconductors as the differential current signal.

Thereby, the single-end outputs of the first and second transconductors whose inversion input terminal and non-inversion input terminal are connected to each other are differential outputs of the transconductor of the present invention. Therefore, the common-mode operating point is robust with respect to a common-mode change in the differential input.

Therefore, the common-mode operating point of the differential output can be stabilized without particularly providing a common-mode feedback circuit, so that the power consumption and the chip area can be reduced. Also, a noise generating factor, such as a current source for stabilizing a common-mode voltage or the like, does not need to be connected to a signal line, thereby making it possible to improve the noise characteristics.

Specifically, the first and second transconductors each comprise a first voltage-to-current conversion circuit and a second voltage-to-current conversion circuit for receiving a positive side and a negative side of the differential voltage signal, respectively, and a current mirror circuit having an input side and an output side to which the first and second voltage-to-current conversion circuits are connected, respectively, in which the single-end current signal is output from a connection point between the second voltage-to-current conversion circuit and the current mirror circuit.

More specifically, the first and second voltage-to-current conversion circuits are each a transistor having a gate which receives a voltage signal and a source connected to a predetermined voltage node.

Thereby, since the first and second voltage-to-current conversion circuits are implemented using, for example, a differential pair of transistors whose sources are grounded, thereby making it possible to further reduce the power consumption and improve the linearity.

Preferably, the transconductor comprises a first variable current source and a second variable current source connected any one of the input side and the output side of the current mirror circuit in each of the first and second transconductors, and a common-mode feedback circuit for controlling the first and second variable current sources based on a difference between an operating point voltage of a differential output of the transconductor and a reference voltage.

Thereby, a common-mode operating voltage of the differential output can be stabilized and kept accurately at a desired voltage. Note that, since the transconductor has a small common-mode gain, a gain of the common-mode feedback loop can be reduced, so that an increase in power consumption and chip area and a deterioration in noise characteristics due to addition of the common-mode feedback circuit do not cause a problem.

Specifically, the first and second variable current sources are connected to output sides of the current mirror circuits of the first and second transconductors, respectively.

Also, specifically, the first and second variable current sources are each a transistor having a gate which receives an output of the common-mode feedback circuit and a source connected to a predetermined voltage node.

Also, preferably, the transconductor comprises a first constant current source and a second constant current source connected to any one of the input side and the output side of the current mirror circuit in the first and second transconductors, respectively.

Thereby, the common-mode operating point of the differential output can be controlled within a wider range by the common-mode feedback circuit and the first and second variable current sources.

Also, specifically, the first and second transconductors each receive a plurality of differential voltage signals.

More specifically, the first and second transconductors each comprise a first voltage-to-current conversion circuit group having a plurality of voltage-to-current conversion circuits connected in parallel, wherein positive sides of the plurality of differential voltage signals are input to the plurality of voltage-to-current conversion circuits, respectively, a second voltage-to-current conversion circuit group having a plurality of voltage-to-current conversion circuits connected in parallel, wherein negative sides of the plurality of differential voltage signals are input to the plurality of voltage-to-current conversion circuits, respectively, and a current mirror circuit having an input side to which the plurality of voltage-to-current conversion circuits of the first voltage-to-current conversion circuit group are each connected, and an output side to which the plurality of voltage-to-current conversion circuits of the second voltage-to-current conversion circuit group are each connected, in which the single-end current signal is output from a connection point between each of the plurality of voltage-to-current conversion circuits of the second voltage-to-current conversion circuit group and the current mirror circuit.

More specifically, the plurality of voltage-to-current conversion circuits of the first and second voltage-to-current conversion circuit groups are each a transistor having a gate which receives a voltage signal and a source connected to a predetermined voltage node.

The present invention also provides an integrator comprising the above-described transconductor, and a capacitor connected between differential output terminals of the transconductor.

Also, an integrator comprises the above-described transconductor, a capacitor connected between input and output terminals of the current mirror circuit in the first transconductor, and a capacitor connected between input and output terminals of the current mirror circuit in the second transconductor.

Also, an integrator comprises the above-described transconductor, a capacitor connected between an output terminal of the first transconductor and an output terminal of the common-mode feedback circuit, and a capacitor connected between an output terminal of the second transconductor and the output terminal of the common-mode feedback circuit.

Thereby, the capacitor connected between the output terminal of each of the first and second transconductors and the output terminal of the common-mode feedback circuit functions not only as a filter capacitor but also as a phase compensating capacitor of common-mode feedback, resulting in a stabler common-mode operating point of the differential output.

Also, an integrator comprises the above-described transconductor, a capacitor connected between differential output terminals of the transconductor, a capacitor connected between an output terminal of the first transconductor and an output terminal of the common-mode feedback circuit, a capacitor connected between an output terminal of the second transconductor and the output terminal of the common-mode feedback circuit, a capacitor connected between input and output terminals of the current mirror circuit in the first transconductor, and a capacitor connected between input and output terminals of the current mirror circuit in the second transconductor.

Thereby, each of the capacitors connected between the input and output terminals of the current mirror circuits plays a role not only in serving as a filter capacitor but also in canceling a signal delay in the current mirror circuit, resulting in an improvement in radio-frequency characteristics of the integrator.

The present invention also provides a filter circuit comprising any of the above-described integrators.

DETAILED DESCRIPTION OF THE PREFFERED EMBODYMENTS

Hereinafter, embodiments of the present invention will be described with reference to the accompanying drawings.

First Embodiment

Figure 1:
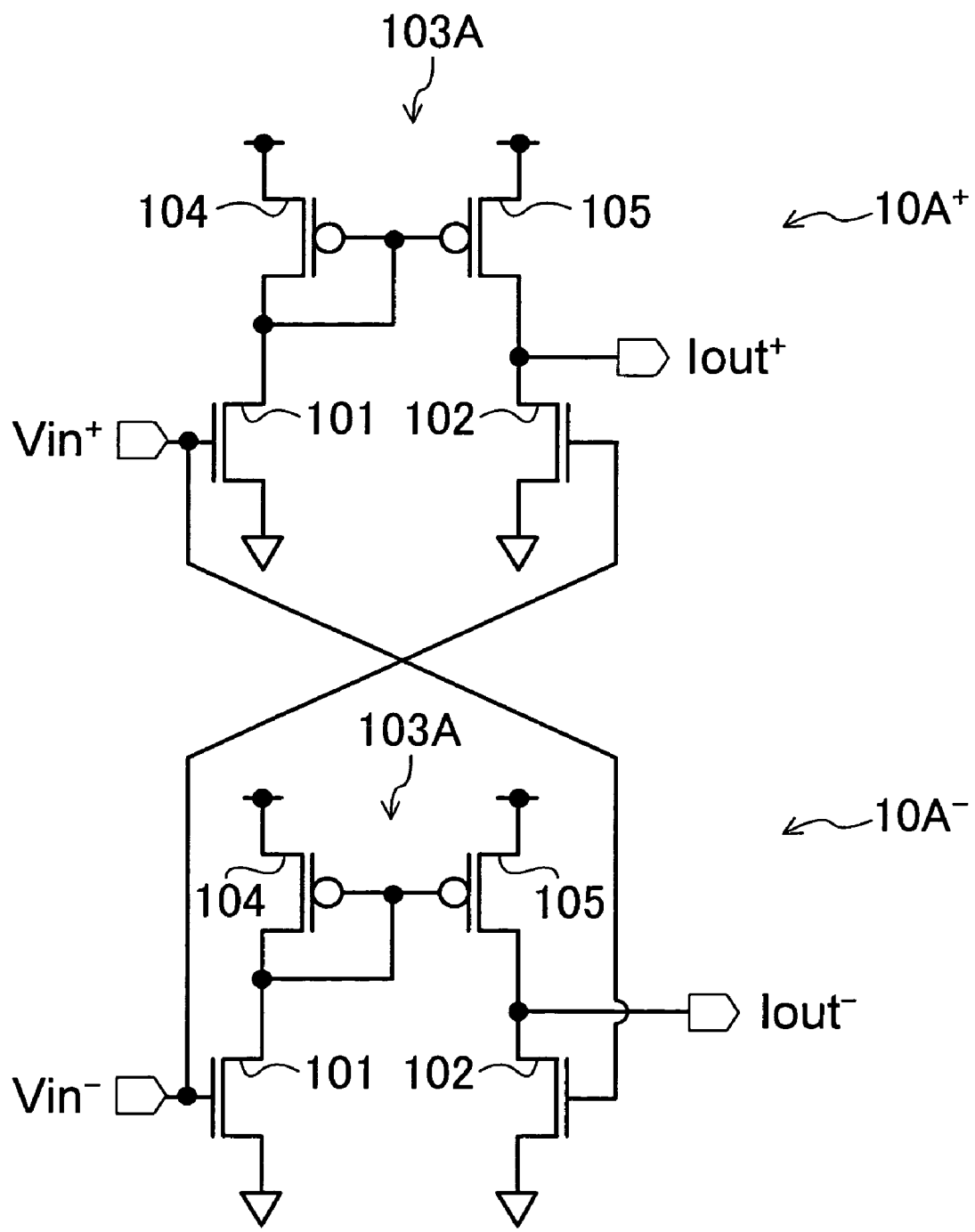
FIG. 1 is a diagram illustrating a configuration of a transconductor according to a first embodiment.

FIG. 1 illustrates a configuration of a transconductor according to a first embodiment. This transconductor comprises transconductors $10A^+$ and $10A^-$ each of which receives a differential voltage signal and outputs a single-end current signal. An inversion input terminal of one of the transconductors $10A^+$ and $10A^-$ is connected with a non-inversion input terminal of the other. Differential voltage signals $(Vin^+-Vin^-)$ and $(Vin^--Vin^+)$ are input to the input transconductors $10A^+$ and $10A^-$, respectively. Current signals $Iout^+$ and $Iout^-$ are output from single-end output terminals of the transconductors $10A^+$ and $10A^-$, respectively.

Specifically, the transconductor 10A (a superscript is removed when the transconductors $10A^+$ and $10A^-$ are not distinguished from each other, and the same applies to the other reference characters) comprises transistors 101 and 102 (voltage-to-current conversion circuits) and a current mirror circuit 103A. The current mirror circuit 103A comprises transistors 104 and 105. The transistor 101 is connected to an input side of the current mirror circuit 103A, and the transistor 102 is connected to an output side of the current mirror circuit 103A.

In this transconductor, a differential current signal $(Iout^+-Iout^-)$ is output from the output side of the current mirror circuit 103A of each of the transconductors $10A^+$ and $10A^-$. Therefore, a common-mode operating point of a differential output of this transconductor spontaneously becomes stable at an appropriate point between a power supply voltage and a ground voltage. This transconductor has a common-mode gain of about "1", which is about 1/100 of that of conventional fully differential transconductors. This means that this transconductor has a common-mode voltage which is about 100 times as stable as those of conventional transconductors.

As described above, according to this embodiment, the output terminal voltage of a transconductor can be stabilized without particularly providing a common-mode feedback circuit. In other words, a transconductor which has a low power, a small area, and excellent noise characteristics, can be obtained. The number of transistors (stages) inserted in series between a power supply node and a ground node is two, and therefore, this transconductor can operate at a low voltage and has relatively low power consumption. The capability of a low-voltage operation means that a low-breakdown-voltage transistor which has a thin gate oxide film and high current efficiency can be used as each of the transistors 101, 102, 104 and 105. Thus, by using the low-breakdown-voltage transistors, a lower power can be obtained.

Figure 10:
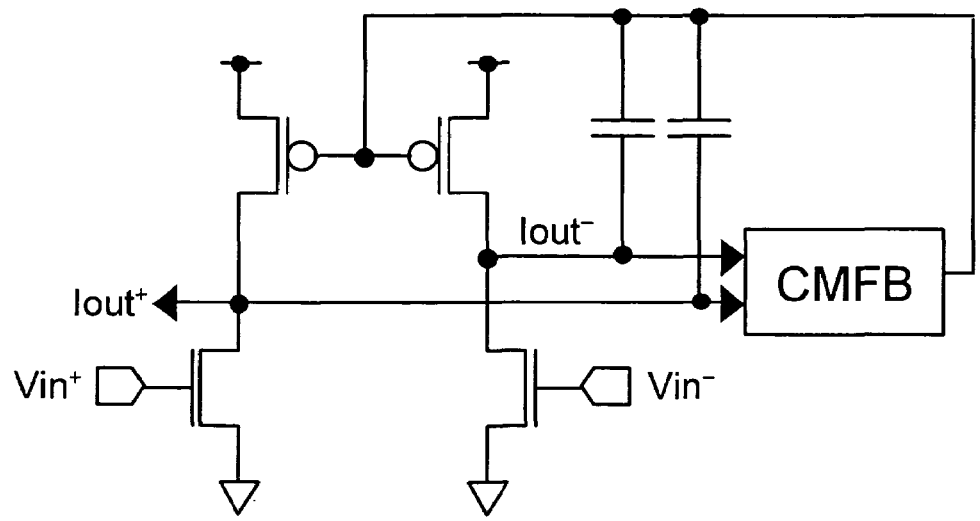
FIG. 10 is a diagram illustrating a configuration of a conventional fully differential transconductor.

The transconductor of this embodiment comprises the two transconductors $10A^+$ and $10A^-$, and therefore, may seem to have a circuit scale larger than that of conventional fully differential transconductors (see FIG. 10). However, since the transconductor 10A needs to output only either a positive side or a negative side of the differential current signal, so that the gm value of the transistors 101 and 102 may be half of that of conventional fully differential transconductors. Therefore, a size of the transistors 101 and 102 is half of that of conventional fully differential transconductors, and the circuit scale is substantially the same as that of conventional fully differential transconductors. Furthermore, as described above, the transconductor of this embodiment does not require a common-mode feedback circuit, and therefore, the whole circuit scale can be caused to be smaller than that of conventional fully differential transconductors, which require a common-mode feedback circuit.

Note that the transistors 101 and 102 may be replaced with voltage-to-current conversion circuits in forms different from that of FIG. 1. However, preferably, it is assumed that the single transistors 101 and 102 are used as voltage-to-current conversion circuits, as illustrated in FIG. 1. The transistors 101 and 102 operate in a saturated region, and output, from the drains thereof, the differential current signal $(Iout^+-Iout^-)$ which is proportional to the differential voltage signal $(Vin^+-Vin^-)$ applied between the gates thereof. Thus, by using the transistors 101 and 102, a voltage-to-current conversion circuit which has a high level of gm/Ids (Ids is a drain-source current), high current efficiency and low power consumption, can be achieved. Also, the transistors 101 and 102 whose sources are grounded are a differential pair (pseudo-differential configuration), and therefore, the linearity thereof is kept high. Note that the transistors 101 and 102 are preferably operated in a more deeply saturated region while a gate-source voltage thereof is kept high. Thereby, a higher level of linearity can be obtained.

Figure 2:
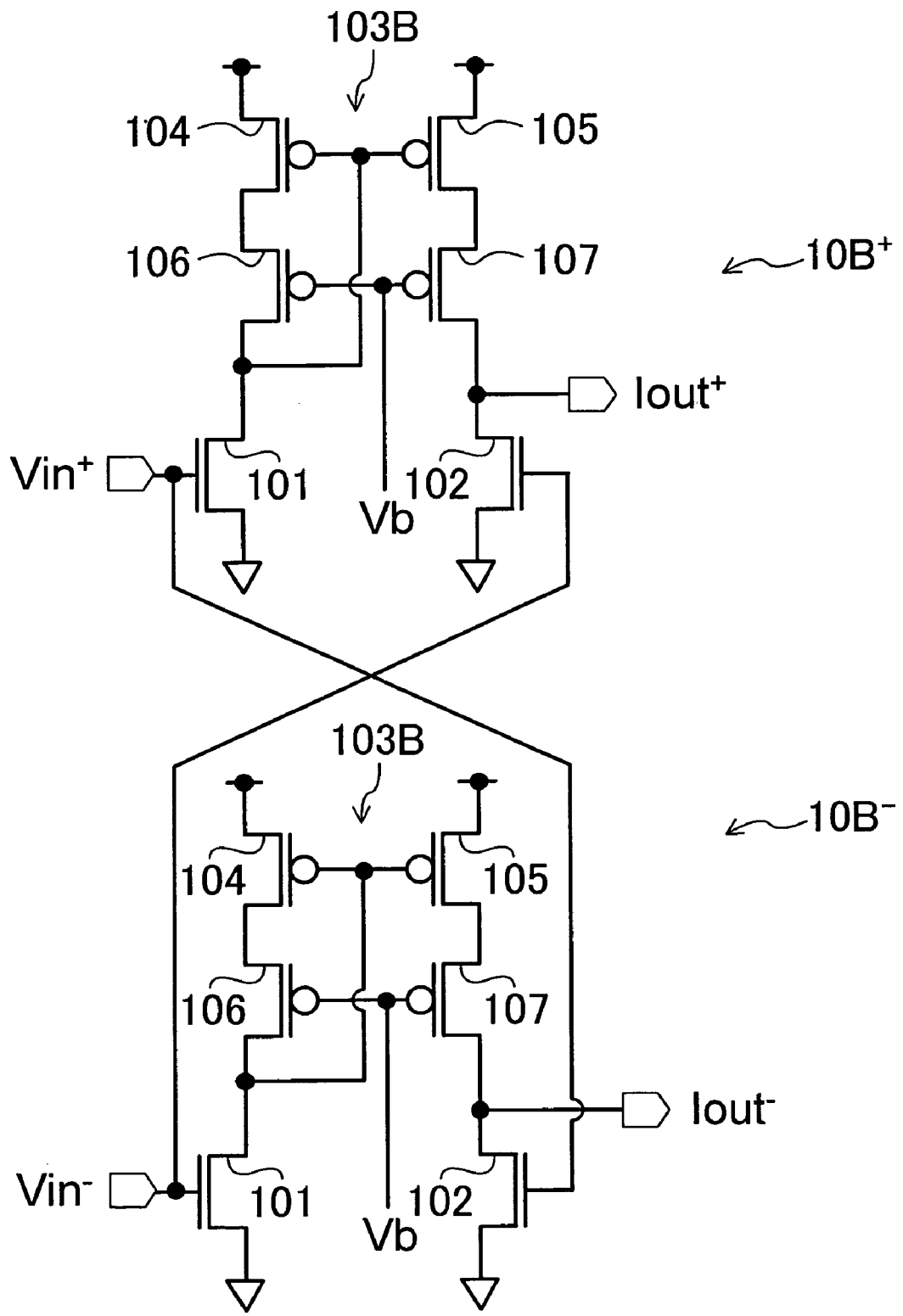
FIG. 2 is a diagram illustrating another exemplary configuration of the transconductor of the first embodiment.

Also, the current mirror circuit 103A may be replaced with that of a cascade type. FIG. 2 illustrates another exemplary configuration of the transconductor of this embodiment. This transconductor comprises transconductors $10B^+$ and $10B^-$. A current mirror circuit 103B in the transconductor 10B obtained by connecting, in series, transistors 106 and 107 to whose gate a bias voltage Vb is applied to the transistors 104 and 105 in the current mirror circuit 103A of FIG. 1. By using such a cascade type current mirror circuit 103B, the constant current property of the output current of this transconductor is improved.

Figure 3:
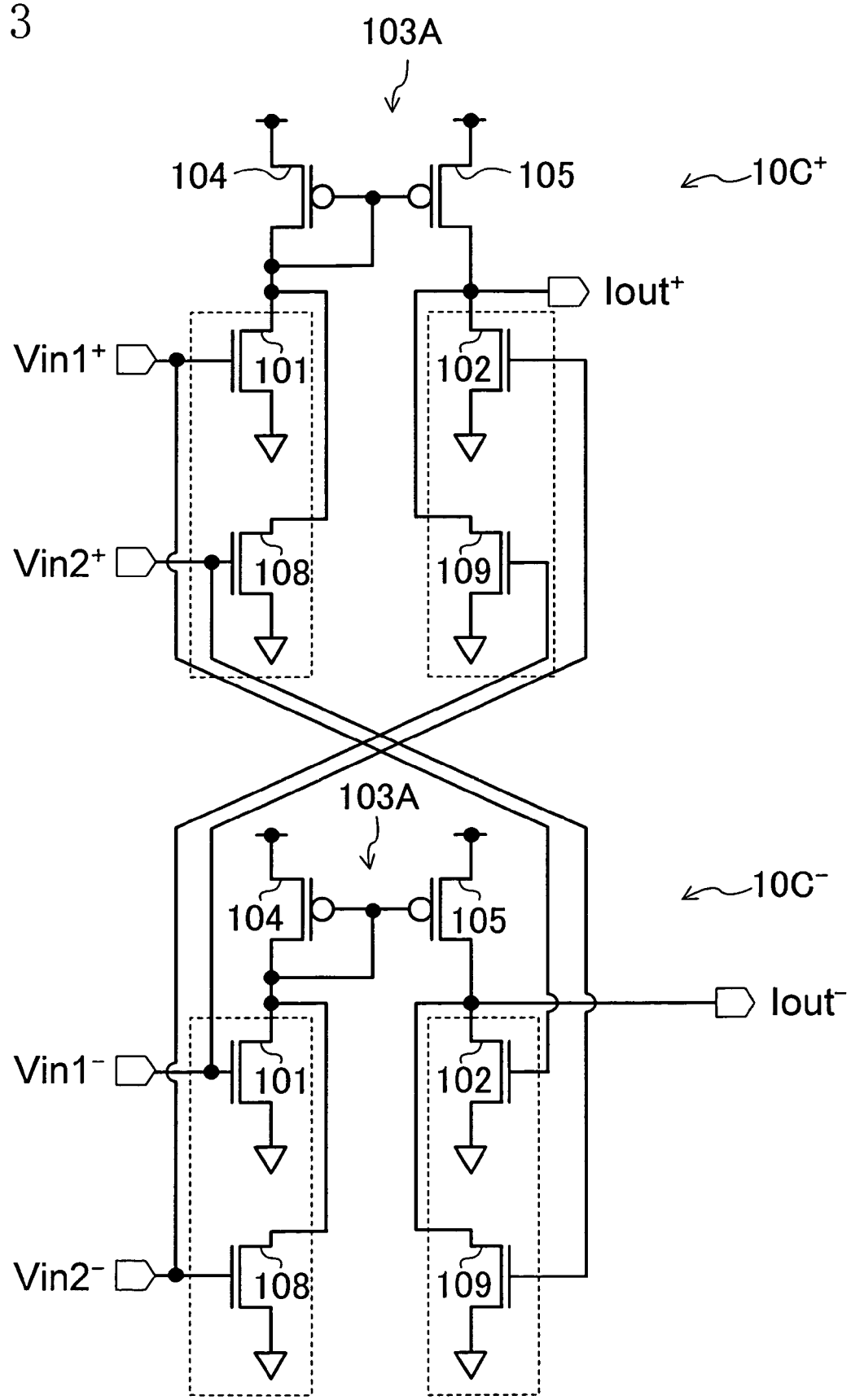
FIG. 3 is a diagram illustrating still another exemplary configuration of the transconductor of the first embodiment.
Figure 11:
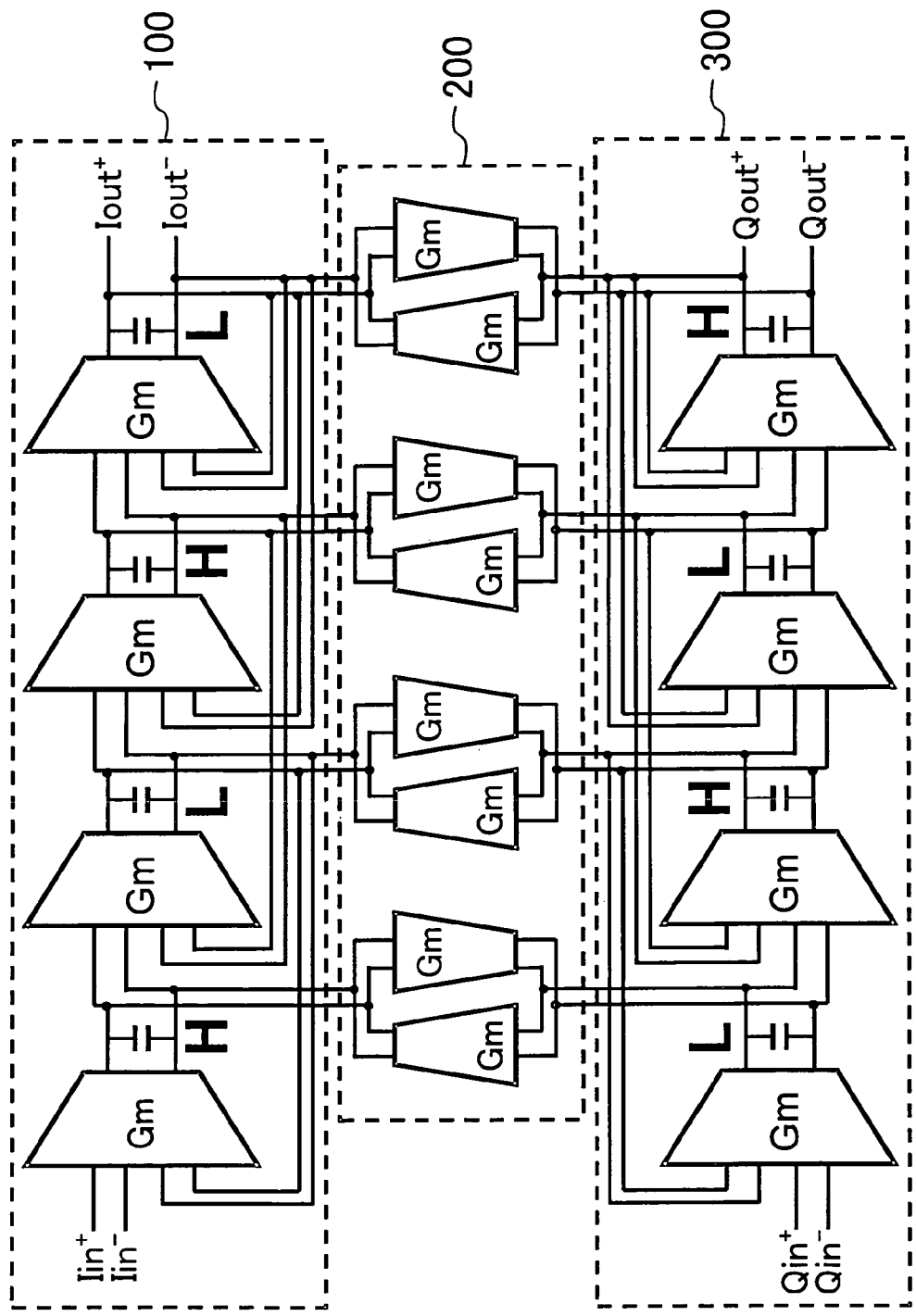
FIG. 11 is a diagram illustrating a configuration of a complex filter composed of fully differential transconductors and capacitors.

Also, the transconductor of this embodiment can be modified into a transconductor having a plurality of differential input as illustrated in FIG. 11. FIG. 3 illustrates still another exemplary configuration of the transconductor of this embodiment. This transconductor comprises transconductors 10C+ and 10C−, receives two differential voltage signals (Vin1+−Vin1−) and (Vin2+−Vin2−), and outputs a differential current signal (Iout+−Iout−). The transconductor 10C comprises the current mirror circuit 103A of FIG. 1, transistors 101 and 108 connected in parallel (voltage-to-current conversion circuit group), and transistors 102 and 109 connected in parallel (voltage-to-current conversion circuit group). The transistors 101 and 108 are connected to the input side of the current mirror circuit 103A, and the transistors 102 and 109 are connected to the output side of the current mirror circuit 103A. Thus, by providing the parallel transconductor input stages to share the current mirror circuit 103A, a multi-input transconductor can be easily achieved.

Second Embodiment

In the transconductor of the first embodiment, for example, as illustrated in FIG. 1, the transistors 101 and 102 having the pseudo-differential configuration are used to perform voltage-to-current conversion. Therefore, the gm value of the transconductor is equal to the gm value of each of the transistors 101 and 102. In other words, the gm value of the transconductor of the first embodiment is influenced by the common-mode operating point of the differential voltage signal (Vin+−Vin−). More specifically, an operating point of the differential output of the transconductor of the first embodiment varies depending on ambient temperature, a power supply voltage, a process variation, and the like as well as an input operating point. A change in the output operating point particularly causes a deterioration in characteristics of applications in which a plurality of transconductors are connected in cascade, such as, for example, a Gm-C filter as illustrated in FIG. 11. Therefore, a stable output operating point is further required for the transconductor of the first embodiment. A transconductor according to a second embodiment which will be hereinafter described can control the output operating point more accurately.

Figure 4:
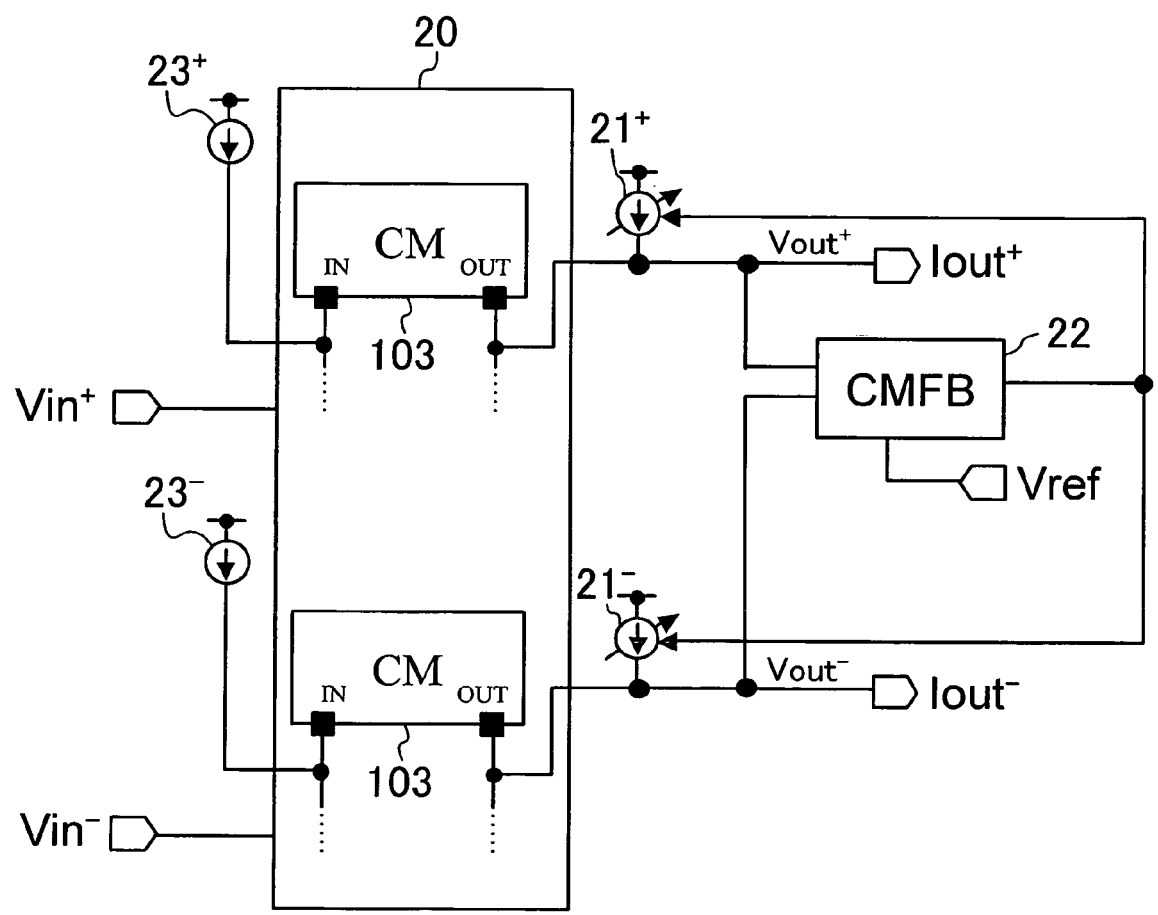
FIG. 4 is a diagram illustrating a configuration of a transconductor according to a second embodiment.

FIG. 4 illustrates a configuration of the transconductor of the second embodiment. This transconductor is obtained by additionally providing, to a transconductor 20 of the first embodiment, variable current sources 21+ and 21−, a common-mode feedback circuit 22, and constant current sources 23+ and 23−. Note that a portion of the internal configuration of the transconductor 20 is not illustrated in FIG. 4.

The variable current sources 21+ and 21− are connected to a positive side and a negative side of a differential output of this transconductor, respectively, to supply a variable current to output terminals of this transconductor. A common-mode output terminal voltage increases with an increase in amount of current supplied from the variable current source 21. Specifically, the variable current source 21 can be implemented using a transistor whose drain is connected to a power supply node and to whose gate a control signal is applied from the common-mode feedback circuit 22.

The common-mode feedback circuit 22 detects an operating point voltage of the differential output based on output terminal voltages Vout+ and Vout− of this transconductor, and based on a difference between the detected voltage and a reference voltage Vref, controls the variable current sources 21+ and 21−. Specifically, the common-mode feedback circuit 22 can be implemented using a differential amplifier to which an intermediate voltage between the output terminal voltages Vout+ and Vout− and the voltage and reference voltage Vref are input.

The constant current sources 23+ and 23− are connected to input sides of two current mirror circuits 103 of the transconductor 20, respectively, and supply a constant current to the respective connection points. When the constant current is supplied to the input side of the current mirror circuit 103, a voltage of an output side of the current mirror circuit 103 (i.e., the common-mode output terminal of this transconductor) decreases. When the variable current source 21 is implemented using a single transistor, the output terminal voltage cannot be caused to be lower than or equal to an initial value thereof. Therefore, by providing a constant current source 23 to previously set the output terminal voltage to be low, the output terminal voltage can be controlled within a wider range by the variable current source 21. The constant current source 23 may be particularly removed.

Even if the gain of the common-mode feedback circuit 22 provided in this transconductor is smaller by one to two orders of magnitude than in the conventional art, the gain is still sufficient, since the output operating point of the transconductor 20 is stable to some extent without the common-mode feedback circuit 22. In other words, the common-mode feedback circuit 22 which has a considerably small scale is sufficient. Therefore, an increase in power consumption and circuit scale due to the addition of the common-mode feedback circuit 22 does not particularly cause a problem. Although the variable current sources 21 and the constant current source 23 are connected to a signal line in this transconductor, currents supplied from the current sources may be small. This is because the common-mode voltage of this transconductor responds with high sensitivity to the currents of the variable current source 21 and the constant current source 23. For example, the voltage of the output operating point can be significantly changed by a small current of the variable current source 21. Therefore, an increase in power consumption and circuit scale due to the addition of the variable current sources 21 and the constant current source 23 does not particularly cause a problem. Also, noise occurring from the current sources is proportional to the current value. However, as described above, the currents supplied from the variable current source 21 and the constant current source 23 may be small, so that noise occurring from the current sources can be kept at a sufficiently low level.

As described above, according to this embodiment, the operating point voltage of the differential output of the transconductor can be controlled with high accuracy, thereby further stabilizing the output operating point. This is particularly advantageous when a Gm-C filter or the like is constructed.

Note that, as illustrated in FIG. 10, phase compensating capacitors may be provided between the differential output terminals and the output terminal of the common-mode feedback circuit 22 so as to stabilize common-mode feedback. In the transconductor of this embodiment, a gain of a common-mode feedback loop is considerably small. Therefore, the phase compensating capacitors may be small, which do not particularly lead to an increase in circuit scale.

Alternatively, the constant current source 23 may be a constant current source which extracts a constant current from the output side of the current mirror circuit 103. Alternatively, the variable current source 21 may be a variable current source which extracts a variable current from the output side of the current mirror circuit 103, and the constant current source 23 may be a constant current source which extracts a constant current from the input side of the current mirror circuit 103. Alternatively, the variable current source 21 may be a variable current source which extracts a variable current from the output side of the current mirror circuit 103, and the constant current source 23 may be a constant current source which supplies a constant current to the output side of the current mirror circuit 103. Note that, specifically, the variable current source which extracts a variable current from the output side of the current mirror circuit 103 is implemented using a transistor whose source is connected to a ground node and to whose gate a control signal is input from the common-mode feedback circuit 22.

Figure 5:
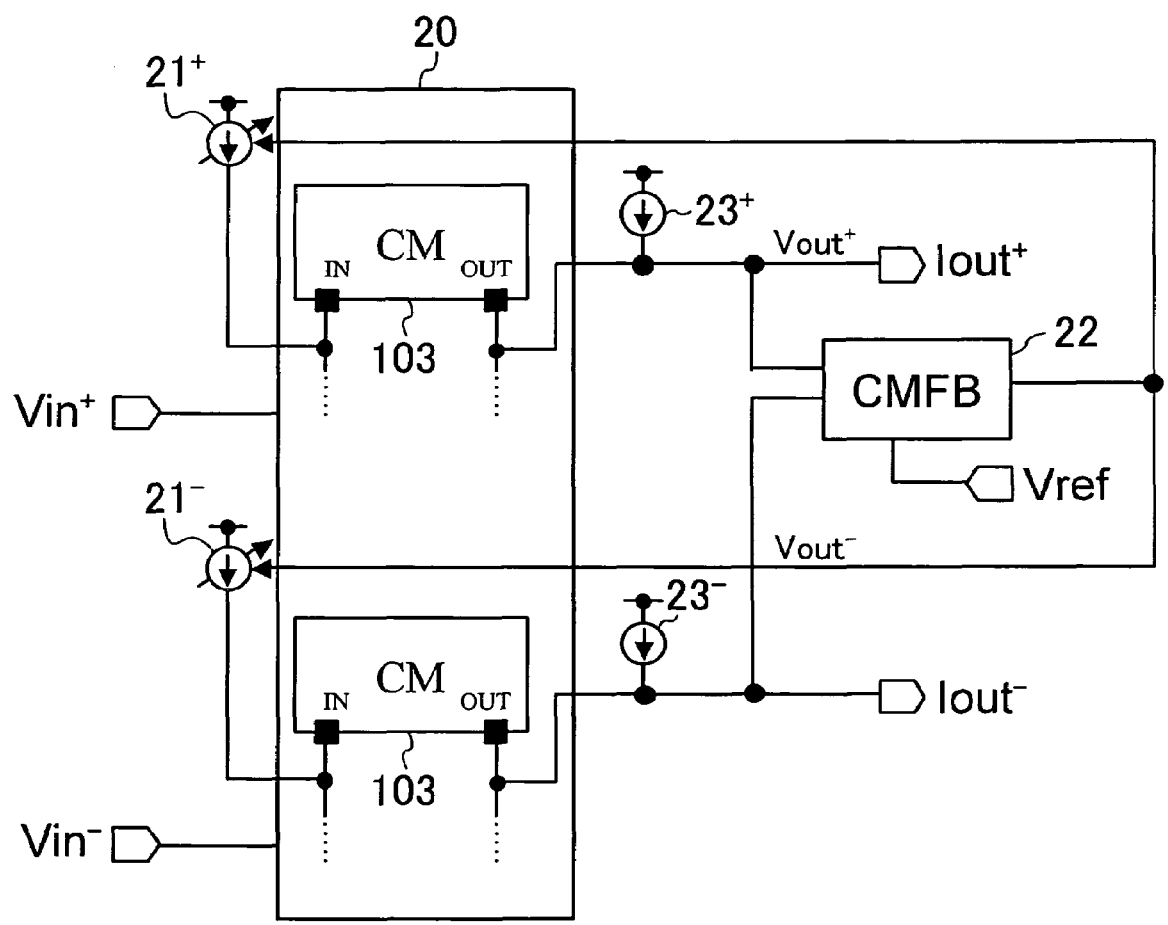
FIG. 5 is a diagram illustrating another exemplary configuration of the transconductor of the second embodiment.

Alternatively, a constant current may be supplied to the output side of the current mirror circuit 103, and a variable current is supplied to the input side thereof. FIG. 5 illustrates another exemplary configuration of the transconductor of this embodiment. In this transconductor, variable current sources 21$^+$ and 21$^-$ are connected to input sides of two current mirror circuits 103 of a transconductor 20, respectively, and supply a variable current to the respective connection points. Constant current sources 23$^+$ and 23$^-$ are connected to a positive side and a negative side of a differential output of this transconductor, respectively, and supply a constant current to output terminals of this transconductor. Thus, the above-described effect is obtained even when the configuration of the transconductor is changed. However, when the variable current source 21 is connected to the input side of the current mirror circuit 103, the common-mode feedback loop becomes long, so that the common-mode feedback becomes unstable. Therefore, preferably, as illustrated in FIG. 4, the variable current source 21 is connected to the output side of the current mirror circuit 103.

Note that, regarding the other example of FIG. 5, the constant current source 23 may be a constant current source which extracts a constant current from the input side of the current mirror circuit 103. Alternatively, the variable current source 21 may be a variable current source which extracts a variable current from the input side of the current mirror circuit 103, and the constant current source 23 may be a constant current source which extracts a constant current from the output side of the current mirror circuit 103. Alternatively, the variable current source 21 may be a variable current source which extracts a variable current from the input side of the current mirror circuit 103, and the constant current source 23 may be a constant current source which supplies a constant current to the input side of the current mirror circuit 103. Note that, specifically, the variable current source which extracts a variable current from the input side of the current mirror circuit 103 can be implemented using a transistor whose source is connected to a ground node and to whose gate a control signal is input from the common-mode feedback circuit 22.

Third Embodiment

Figure 6:
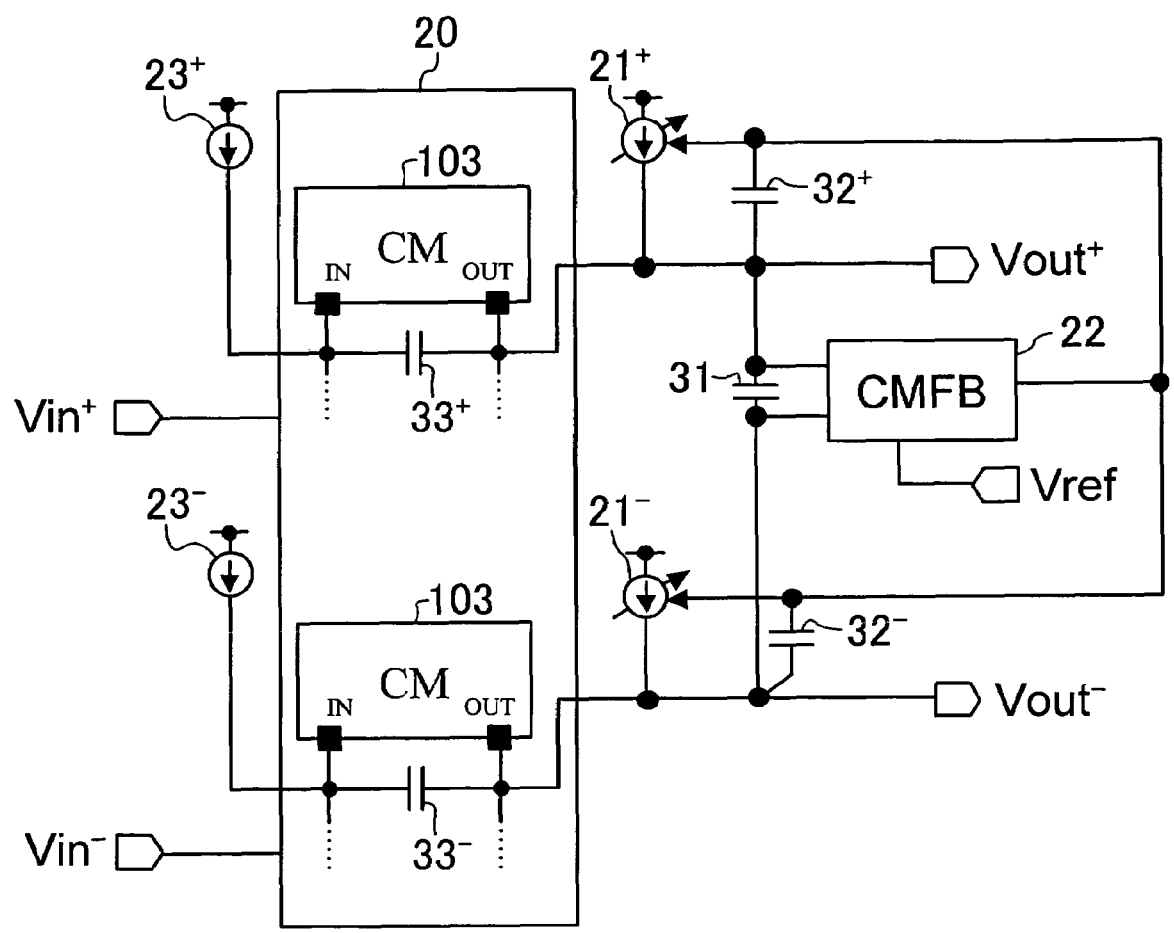
FIG. 6 is a diagram illustrating a configuration of a integrator according to a third embodiment.

An integrator is constructed by adding a capacitor to the transconductor of each embodiment above. For example, in the case of the transconductor of FIG. 4, there are three portions to which a capacitor is connected: between the differential output terminals; between the differential output terminal and the output terminal of the common-mode feedback circuit 22; and between the input and output terminals of the current mirror circuit 103. FIG. 6 illustrates a configuration of an integrator according to a third embodiment. This integrator is obtained by adding capacitors 31, 32$^+$ and 32$^-$, and 33$^+$ and 33$^-$ to the above-described three portions of the transconductor of FIG. 4. The capacitor 31 is connected between the differential output terminals of the transconductor. The capacitors 32$^+$ and 32$^-$ are each connected between the differential output terminal and the output terminal of the common-mode feedback circuit 22. The capacitors 33$^+$ and 33$^-$ are each connected between the input and output terminals of the current mirror circuit 103. This integrator outputs a voltage between both ends of the capacitor 31 as a differential voltage signal (Vout$^+$−Vout$^-$).

Figure 7:
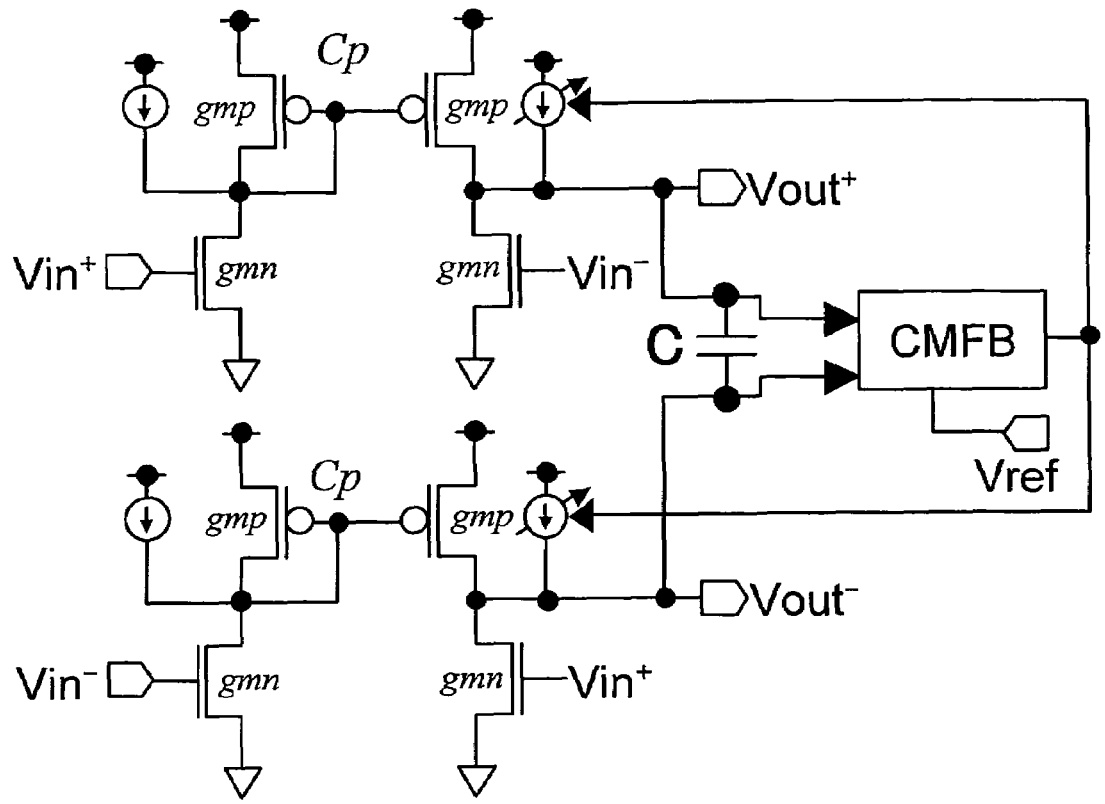
FIG. 7 is a diagram illustrating a capacitance value when a capacitor is connected between differential output terminals of a transconductor.

Here, filter capacitance values when the capacitors are respectively connected to the three portions are compared. When the capacitance value between the differential output terminals is represented by "C" (see FIG. 7), the capacitance value between the differential output terminal and the output terminal of the common-mode feedback circuit 22, which is equivalent to "C", is "2C" (see FIG. 8), and the capacitance value between the input and output terminals of the current mirror circuit 103 is "C" (see FIG. 9). Specifically, comparing to when a capacitance (C) is connected between the differential output terminals, two times the capacitance (C×2) is required when a capacitor is connected between the input and output terminals of the current mirror circuit 103, and a total of four times the capacitance (2C×2) is required when a capacitor is connected between the differential output terminal and the output terminal of the common-mode feedback circuit 22. Therefore, when the capacitance values of the capacitors 31, 32 and 33 of the integrator of FIG. 6 are represented by C1, C2 and C3, respectively, only a total of capacitances (C1+C2/2+C3) functions as a filter capacitor though a total of capacitances (C1+2C2+2C3) is connected. Thus, when attention is paid only to the filter capacitor, it seems that the capacitors other than one provided between the differential output terminals undesirably cause inefficiency and an increase in chip area. However, as described below, the capacitors other than one provided between the differential output terminals play an important role other than a filter capacitor. Therefore, capacitors may be provided at the above-described three portions as appropriate in accordance with a required specification.

<Capacitor Between Differential Output Terminal and Output Terminal of Common-Mode Feedback Circuit>

The capacitor 32 between the differential output terminal and the output terminal of the common-mode feedback circuit 22 functions as a phase compensating capacitor for stabilizing common-mode feedback as well as a filter capacitor. In other words, the capacitor 32 functions as a phase compensating capacitor for the common-mode feedback circuit 22 in a common-mode mode, and as a ground capacitor connected to the differential output terminal of the transconductor 20 in a differential mode, i.e., has two functions. Therefore, the capacitor 32 is disadvantageous in terms of area since the whole of the capacitor 32 as a filter capacitor requires four times the area of the capacitor 31, but has a high level of use efficiency since the two functions are possessed. Note that, even if the capacitor 32 is provided, the capacitance value may be considerably small since the gain of the common-mode feedback loop in this integrator is small. Also, when the gain of the common-mode feedback loop is sufficiently small, the capacitor 32 may be particularly removed.

<Capacitor between Input and Output Terminals of Current Mirror Circuit>

A differential output of this integrator is output from the output side of the current mirror circuit 103 in the transconductor 20, so that the common-mode operating point becomes stable in an appropriate point between a power supply voltage and a ground voltage. However, the current mirror circuit 103 intervenes between the input and output, so that a delay occurs, resulting in a deterioration in transfer characteristics. Particularly, in the case of a Gm-C filter constructed using this integrator, when an input frequency is high, radio-frequency gain characteristics of the filter are likely to depart from ideal values due to an influence of the delay caused by the current mirror circuit.

Figure 8:
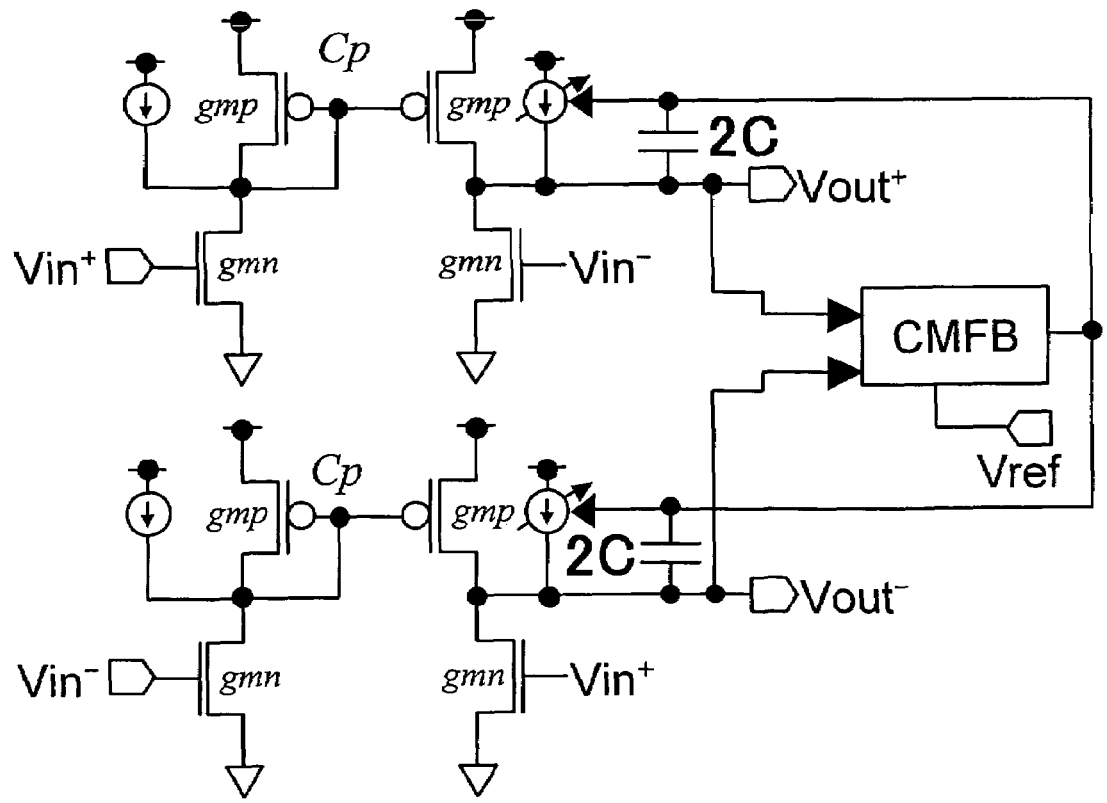
FIG. 8 is a diagram illustrating a capacitance value when a capacitor is connected between a differential output terminal of a transconductor and an output terminal of a common-mode feedback circuit.

For example, when the integrator of FIG. 8 is employed as an integrator which does not have a capacitor between the input and output terminals of the current mirror circuit 103, a transfer function of a positive side of the differential output and a transfer function of the differential output are respectively represented by:

$$Vout^+ = \frac{gmn}{2sC}\left(\frac{gmp}{gmp+sCp}Vin^+ - Vin^-\right) \quad (1)$$

$$Vout^+ - Vout^- = \frac{gmn}{2sC} \cdot \frac{2gmp+sCp}{gmp+sCp} \cdot (Vin^+ - Vin^-) \quad (2)$$

where gmn represents a gm value of each transistor which receives a voltage signal Vin⁺ or Vin⁻, gmp represents a gm value of each transistor constituting the current mirror circuit 103, and Cp represents gate parasitic capacitance of each transistor constituting the current mirror circuit 103. In expression (2), a term whose denominator is composed only of a Laplace operator s and which has ideal integral characteristics, is multiplied by a term (2gmp+sCp)/(gmp+sCp). This term is a delay factor composed of gmp and Cp in the current mirror circuit 103. If a band used in this integrator is sufficiently lower than gmp/Cp, a problem does not particularly arise. If the band used in this integrator is higher than that, frequency characteristics of this term becomes significant. As a result, gain characteristics and the like of a Gm-C filter composed of this integrator depart from ideal values.

Figure 9:
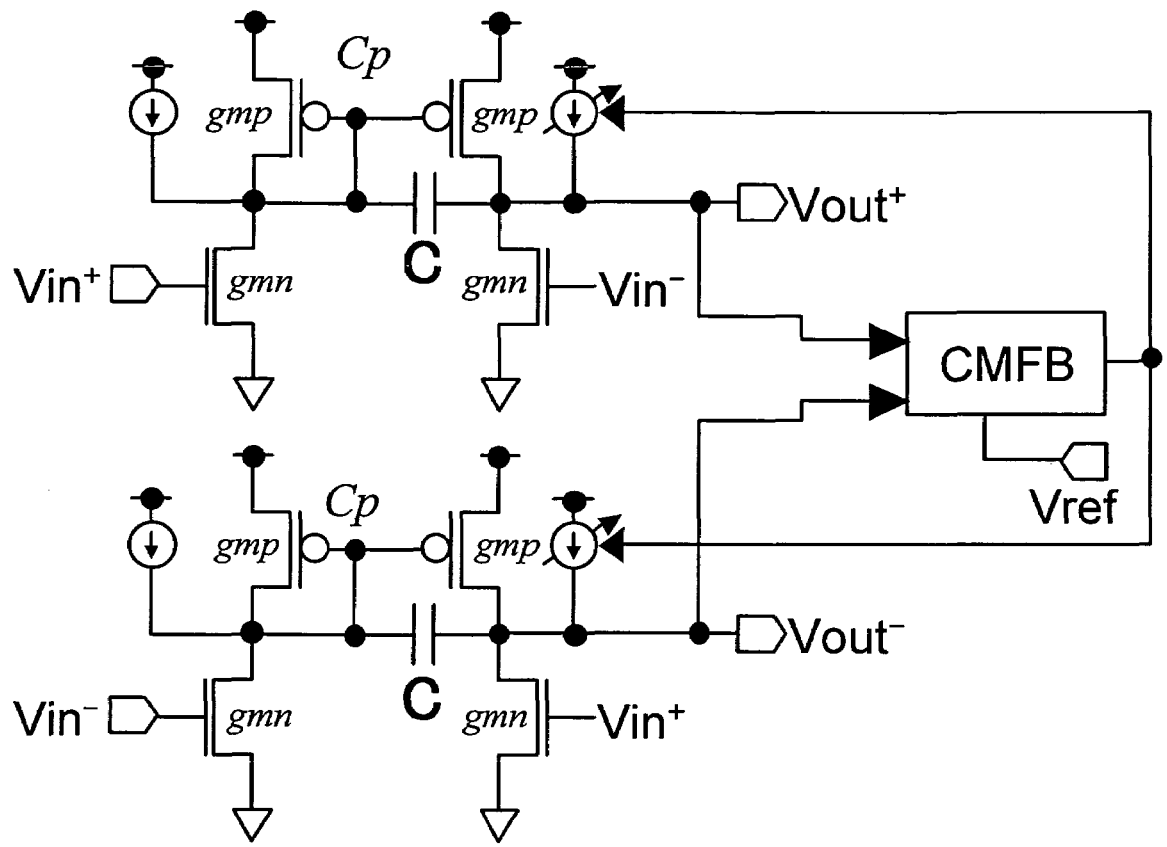
FIG. 9 is a diagram illustrating a capacitance value when a capacitor is connected betweeninput and output terminals of a current mirror circuit.

On the other hand, for example, when the integrator of FIG. 9 is employed as an integrator having a capacitor between the input and output terminals of the current mirror circuit 103, a transfer function of a positive side of the differential output and a transfer function of the differential output are represented by the following expressions (3) and (4), respectively.

$$Vout^+ = \frac{gmn}{sC(sCp+2gmp)} \quad (3)$$
$$(gmp \cdot Vin^+ - gmp \cdot Vin^+ - sC \cdot Vn^+ - sC \cdot Vin^- - sCp \cdot Vin^-)$$

$$Vout^+ - Vout^- = \frac{gmn}{sC} \cdot (Vin^+ - Vin^-) \quad (4)$$

Expression (4) has a denominator composed only of a Laplace operator s, thereby providing ideal integral characteristics. In other words, a delay due to gmp and Cp in the current mirror circuit 103 is canceled. Thus, the capacitor 33 between the input and output terminals of the current mirror circuit 103 plays a role in improvement of radio-frequency characteristics of this integrator as well as serving as a filter capacitor. Therefore, the capacitor 33 is disadvantageous in terms of a reduction in chip area, since the whole of the capacitor 33 as a filter capacitor requires two times the area of the capacitor 31, however, the use efficiency is satisfactory since the above-described two functions are provided.

When radio-frequency characteristics are not particularly required, the capacitor 33 may be removed, so that the capacitor 31 is instead enlarged, thereby making it possible to construct a small-area integrator which has a smaller total capacitance value. Also, by reducing a size of the current mirror circuit 103 to shift the delay pole of the current mirror (gmp/Cp) into a high frequency region, a deterioration in gain characteristics of the filter can be suppressed to a sufficiently small level without the capacitor 33 in the case of a band of about 10 MHz. When higher-frequency characteristics are required, the high-frequency characteristics of the filter can be improved by enlarging the capacitor 33.

As described above, according to this embodiment, an integrator which has a low power and a small area, and excellent noise characteristics can be achieved. In addition, the common-mode operating point of the differential output can be further stabilized and the radio-frequency characteristics can be easily improved, in accordance with a required specification. This is particularly advantageous when a Gm-C filter which processes a radio-frequency signal, or the like is constructed.

Note that, even when a capacitor is connected to the transconductor of FIG. 5, an integrator having an effect similar to that described above is obtained. Also, regarding the transconductors of FIGS. 1 to 3 which do not have a common-mode feedback circuit, an integrator having an effect similar to that described above is obtained by connecting a capacitor between the differential output terminals and/or between the input and output terminals of the current mirror circuit.

Also, the integrator of this embodiment can be used to construct a filter circuit, such as, for example, the complex filter circuit of FIG. 11.

The transconductor, the integrator and the filter circuit of the present invention have a low power, low noise, high linearity, and a small area, and therefore, are particularly useful for a radio apparatus, a mobile terminal, a sensor system, and the like which are driven by a battery.

What is claimed is:

1. A transconductor for receiving a differential voltage signal and outputting a differential current signal, comprising:

a first transconductor and a second transconductor for receiving the differential voltage signal and outputting a single-end current signal, wherein an inversion input terminal of one of the first and second transconductors is connected with a non-inversion input terminal of the other, and the transconductor outputs a current signal output from each of the first and second transconductors as the differential current signal, and wherein the first and second transconductors each comprise:

a first voltage-to-current conversion circuit and a second voltage-to-current conversion circuit for receiving a positive side and a negative side of the differential voltage signal, respectively; and a current mirror circuit having an input side and an output side to which the first and second voltage-to-current conversion circuits are connected, respectively, wherein the single-end current signal is output from a connection point between the second voltage-to-current conversion circuit and the current mirror circuit, said transconductor further comprising:

a first variable current source and a second variable current source connected any one of the input side and the output side of the current mirror circuit in each of the first and second transconductors; and a common-mode feedback circuit for controlling the first and second variable current sources based on a difference between an operating point voltage of a differential output of the transconductor and a reference voltage.

2. The transconductor of claim 1, wherein the first and second variable current sources are connected to output sides of the current mirror circuits of the first and second transconductors, respectively.

3. The transconductor of claim 1, wherein the first and second variable current sources are each a transistor having a gate which receives an output of the common-mode feedback circuit and a source connected to a predetermined voltage node.

4. The transconductor of claim 1, comprising:
a first constant current source and a second constant current source connected to any one of the input side and the output side of the current mirror circuit in the first and second transconductors, respectively.

5. A transconductor for receiving a differential voltage signal and outputting a differential current signal, comprising:
a first transconductor and a second transconductor for receiving the differential voltage signal and outputting a single-end current signal,
wherein an inversion input terminal of one of the first and second transconductors is connected with a non-inversion input terminal of the other,
the transconductor outputs a current signal output from each of the first and second transconductors as the differential current signal, and
the first and second transconductors each receive a plurality of differential voltage signals.

6. The transconductor of claim 5, wherein the first and second transconductors each comprise:
a first voltage-to-current conversion circuit group having a plurality of voltage-to-current conversion circuits connected in parallel, wherein positive sides of the plurality of differential voltage signals are input to the plurality of voltage-to-current conversion circuits, respectively;
a second voltage-to-current conversion circuit group having a plurality of voltage-to-current conversion circuits connected in parallel, wherein negative sides of the plurality of differential voltage signals are input to the plurality of voltage-to-current conversion circuits, respectively; and
a current mirror circuit having an input side to which the plurality of voltage-to-current conversion circuits of the first voltage-to-current conversion circuit group are each connected, and an output side to which the plurality of voltage-to-current conversion circuits of the second voltage-to-current conversion circuit group are each connected,
wherein the single-end current signal is output from a connection point between each of the plurality of voltage-to-current conversion circuits of the second voltage-to-current conversion circuit group and the current mirror circuit.

7. The transconductor of claim 6, wherein the plurality of voltage-to-current conversion circuits of the first and second voltage-to-current conversion circuit groups are each a transistor having a gate which receives a voltage signal and a source connected to a predetermined voltage node.

8. An integrator comprising:
a transconductor for receiving a differential voltage signal and outputting a differential current signal, comprising:
a first transconductor and a second transconductor for receiving the differential voltage signal and outputting a single-end current signal,
wherein an inversion input terminal of one of the first and second transconductors is connected with a non-inversion input terminal of the other, and the transconductor outputs a current signal output from each of the first and second transconductors as the differential current signal,
wherein the first and second transconductors each comprise:
a first voltage-to-current conversion circuit and a second voltage-to-current conversion circuit for receiving a positive side and a negative side of the differential voltage signal, respectively; and
a current mirror circuit having an input side and an output side to which the first and second voltage-to-current conversion circuits are connected, respectively,
wherein the single-end current signal is output from a connection point between the second voltage-to-current conversion circuit and the current mirror circuit,
said transconductor further comprising:
a first variable current source and a second variable current source connected any one of the input side and the output side of the current mirror circuit in each of the first and second transconductors; and
a common-mode feedback circuit for controlling the first and second variable current sources based on a difference between an operating point voltage of a differential output of the transconductor and a reference voltage,
said integrator further comprising:
a capacitor connected between an output terminal of the first transconductor and an output terminal of the common-mode feedback circuit; and
a capacitor connected between an output terminal of the second transconductor and the output terminal of the common-mode feedback circuit.

9. An integrator comprising:
a transconductor for receiving a differential voltage signal and outputting a differential current signal, comprising:
a first transconductor and a second transconductor for receiving the differential voltage signal and outputting a single-end current signal,
wherein an inversion input terminal of one of the first and second transconductors is connected with a non-inversion input terminal of the other, and the transconductor outputs a current signal output from each of the first and second transconductors as the differential current signal,
wherein the first and second transconductors each comprise:
a first voltage-to-current conversion circuit and a second voltage-to-current conversion circuit for receiving a positive side and a negative side of the differential voltage signal, respectively; and
a current mirror circuit having an input side and an output side to which the first and second voltage-to-current conversion circuits are connected, respectively,
wherein the single-end current signal is output from a connection point between the second voltage-to-current conversion circuit and the current mirror circuit,
said transconductor further comprising:
a first variable current source and a second variable current source connected any one of the input side and the output side of the current mirror circuit in each of the first and second transconductors; and a common-mode feedback circuit for controlling the first and second variable current sources based on a difference between an operating point voltage of a differential output of the transconductor and a reference voltage, said integrator further comprising:

a capacitor connected between differential output terminals of the transconductor;

a capacitor connected between an output terminal of the first transconductor and an output terminal of the common-mode feedback circuit;

a capacitor connected between an output terminal of the second transconductor and the output terminal of the common-mode feedback circuit;

a capacitor connected between input and output terminals of the current mirror circuit in the first transconductor; and a capacitor connected between input and output terminals of the current mirror circuit in the second transconductor.

* * * * *